(12) United States Patent
Li et al.

(10) Patent No.: US 11,815,314 B2
(45) Date of Patent: Nov. 14, 2023

(54) INTEGRATED VAPOR CHAMBER AND MANUFACTURING METHOD THEREOF

(71) Applicant: NIDEC CHAUN-CHOUNG TECHNOLOGY CORPORATION, New Taipei (TW)

(72) Inventors: Cheng-Hua Li, New Taipei (TW); Ping-Hung He, New Taipei (TW); Chia-Ling Chin, New Taipei (TW)

(73) Assignee: NIDEC CHAUN-CHOUNG TECHNOLOGY CORPORATION, New Taipei (TW)

( * ) Notice: Subject to any disclaimer, the term of this patent is extended or adjusted under 35 U.S.C. 154(b) by 39 days.

(21) Appl. No.: 17/575,629

(22) Filed: Jan. 13, 2022

(65) Prior Publication Data

US 2023/0221077 A1    Jul. 13, 2023

(51) Int. Cl.

| B23P 15/26 | (2006.01) |
|---|---|
| F28D 15/02 | (2006.01) |
| F28D 15/04 | (2006.01) |
| B22F 3/11 | (2006.01) |
| H05K 7/20 | (2006.01) |

(52) U.S. Cl.
CPC ........ *F28D 15/0233* (2013.01); *B22F 3/1103* (2013.01); *B23P 15/26* (2013.01); *F28D 15/0283* (2013.01); *F28D 15/046* (2013.01); *H05K 7/20336* (2013.01); *B23P 2700/09* (2013.01)

(58) Field of Classification Search
CPC ............ F28D 15/0233; F28D 15/0283; F28D 15/046; B22F 3/1103; B23P 15/26; B23P 2700/09; H05K 7/20336
See application file for complete search history.

(56) References Cited

U.S. PATENT DOCUMENTS

| 2012/0285662 A1* | 11/2012 | Meyer, IV | ............... F28D 15/04 |
| | | | 165/104.26 |
| 2017/0227297 A1* | 8/2017 | Wang | ...................... B23P 15/26 |
| 2020/0056845 A1* | 2/2020 | Zhou | ...................... F28D 15/04 |

* cited by examiner

*Primary Examiner* — Nirvana Deonauth
(74) *Attorney, Agent, or Firm* — Chun-Ming Shih; HDLS IPR SERVICES

(57) ABSTRACT

An integrated vapor chamber includes an outer shell and a plurality of composite capillary structures. The outer shell includes a flat casing and a plurality of partitions integrally formed. The flat shell includes a chamber, and the partitions are disposed in the chamber to separate the chamber into a plurality of flow channels. Each composite capillary structure is extended along each flow channel and distributed in the chamber. The composite capillary structure includes a metal mesh and a plurality of sintered powder uniformly sintered in the metal mesh. Furthermore, this disclosure also discloses a manufacturing method of the integrated vapor chamber. Therefore, the manufacturing method of the thin vapor chamber is simplified to improve the yield rate.

5 Claims, 5 Drawing Sheets

INTEGRATED VAPOR CHAMBER AND MANUFACTURING METHOD THEREOF

BACKGROUND OF THE DISCLOSURE

Technical Field

The technical field relates to a vapor chamber, and more particularly relates to an integrated vapor chamber and manufacturing method thereof.

Description of Related Art

A vapor chamber is a high-performance heat dissipation device, which is now widely used in electronic products for heat dissipation. However, due to electronic products being produced in a trend of lighter and thinner, the structure of the vapor chamber is limited to a certain thickness and still needs to keep the thermal conductive efficiency.

In the related-art vapor chamber, the outer shell usually includes an upper and a lower shell which are combined with each other, and the capillary structures and supporting structures are disposed therebetween. Then the welding is performed for combination. The manufacturing process of the vapor chamber is complicated and the working hours is long. Thus, the yield rate of manufacturing is low.

Additionally, the capillary structures of traditional vapor chambers may be grooves, metal meshes, or sintered powder, etc. However, since the capillary structures such as grooves and copper braided metal meshes have specific direction when transmitting working fluid, thus, the capillary capability is not as good as sinter powder which is multi-directional when transmitting working fluid. Furthermore, since the thickness of the vapor chamber is thin, the core rod is not able to be disposed in the shell in the process of sintering. As a result, the overall thickness of the vapor chamber may not be attenuated. Therefore, how to provide a thin vapor chamber structure with a simplified manufacturing process to improve the yield rate is the research motivation of this disclosure.

SUMMARY OF THE DISCLOSURE

One object of this disclosure is to provide an integrated vapor chamber and a manufacturing method thereof, in which the manufacturing process of the thin vapor chamber is simplified to achieve the purpose of improving the yield rate.

In order to achieve the object mentioned above, this disclosure provides an integrated vapor chamber including an outer shell and a plurality of composite capillary structures. The outer shell includes a flat casing and a plurality of partitions integrally formed. The flat casing includes a chamber. The partitions are disposed in the chamber to separate the chamber into a plurality of flow channels. The composite capillary structures are extended along each of the flow channels and distributed in the chamber. Each composite capillary structure includes a metal mesh and a plurality of sintered powder uniformly sintered in the metal mesh.

In order to achieve the object mentioned above, this disclosure provides a manufacturing method of the integrated vapor chamber, including: a) integrally forming a flat casing and a plurality of partitions, wherein the flat casing includes a chamber, and the partitions are disposed in the chamber to separate the chamber into a plurality of flow channels; b) providing a plurality of composite capillary structures, wherein each of the composite capillary structures includes a metal mesh and a plurality of powder uniformly distributed in the metal mesh; c) disposing each metal mesh with the powder in each of the flow channels; d) sintering the composite capillary structures to make the powder be sintered and combined in each metal mesh; e) combining a degassing head on the flat casing; f) degassing the flat casing and injecting a working fluid into the flat casing through the degassing head, and performing vacuuming and sealing; and g) cutting the degassing head.

Comparing with the related art, the outer shell of the integrated vapor chamber of this disclosure includes a flat casing and a plurality of partitions integrally formed. The partitions are disposed in the chamber to separate the chamber into multiple flow channels. The composite capillary structures are disposed along each of the flow channels. Each of the composite capillary structures includes a metal mesh and a plurality of sintered powder uniformly sintered in the metal mesh. The sintered powder is uniformly and flatly combined with the metal mesh. Accordingly, the composite capillary structures are multi-directional and have better capillary capacity. Therefore, the composite capillary structures have better capability of transmitting liquid to increase the practicability of this disclosure.

BRIEF DESCRIPTION OF DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION

Figure 1:
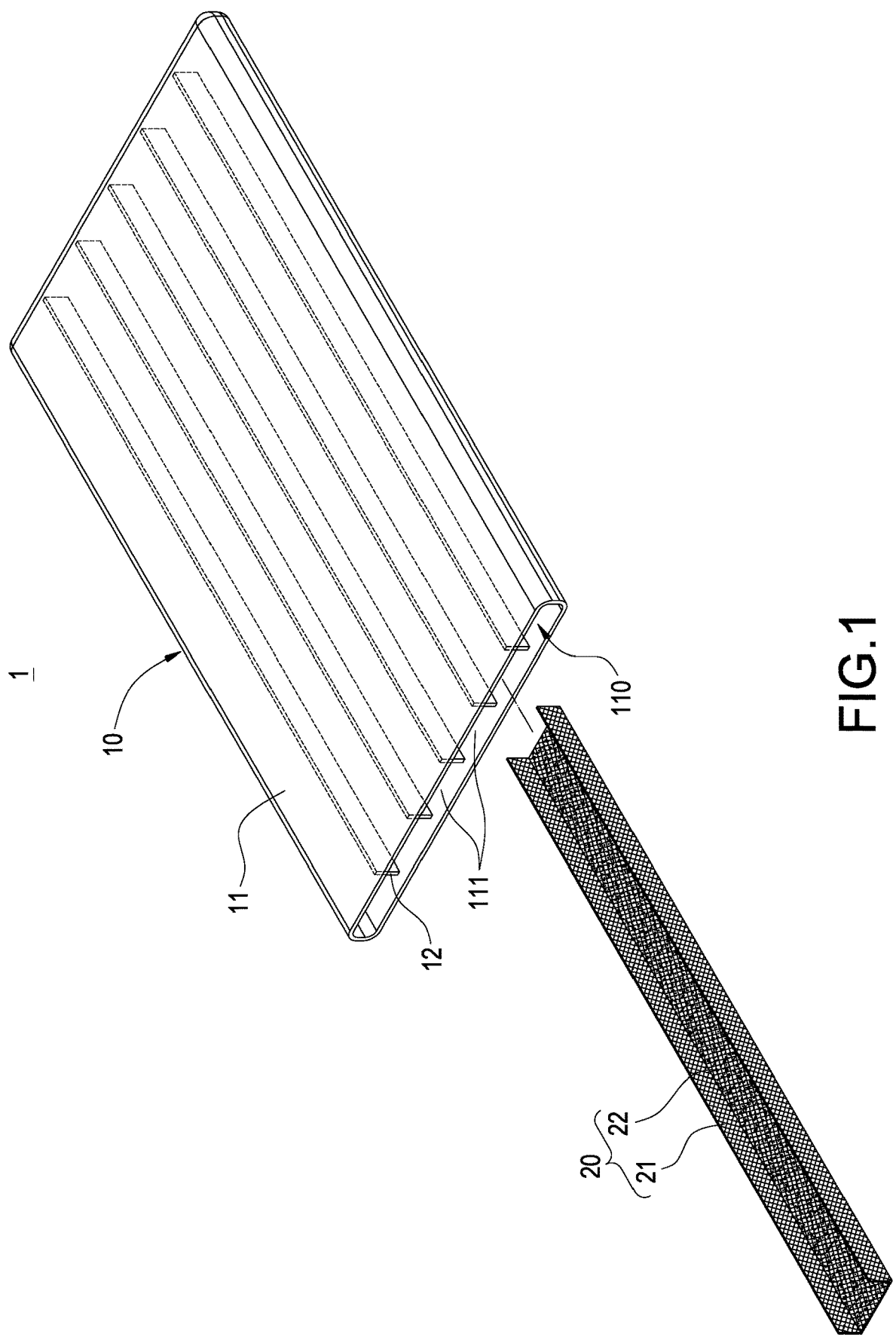
FIG. 1 is a perspective exploded schematic view of the integrated vapor chamber in this disclosure.

The technical contents of this disclosure will become apparent with the detailed description of embodiments accompanied with the illustration of related drawings as follows. It is intended that the embodiments and drawings disclosed herein are to be considered illustrative rather than restrictive.

Please refer to FIG. 1 to FIG. 4, which respectively depict a perspective exploded schematic view in this disclosure, and a perspective schematic view of the integrated vapor chamber in this disclosure, a perspective schematic view of the integrated vapor chamber with the degassing head in this disclosure, and a cross sectional view of the integrated vapor chamber in this disclosure. This disclosure is an integrated vapor chamber 1 including an outer shell 10 and a plurality of composite capillary structures 20 disposed in the outer shell 10. More detail of the integrated vapor chamber 1 is described as follows.

The outer shell 10 includes a flat casing 11 and a plurality of partitions 12 integrally formed. The flat casing 11 is made of a metal heat conductor, such as copper or aluminum, etc.

The flat casing 11 includes a chamber 110, and the partitions 12 are disposed in the chamber 110 to separate the chamber 110 into a plurality of flow channels 111.

Specifically, the partitions 12 are integrally formed with the flat casing 11 through process such as extrusion or drawing, etc. Moreover, the flow channels 111 are arranged spacedly and parallelly to each other, and each of the flow channels 111 is an independent passageway.

The composite capillary structures 20 are porous structures, which are extended along each of the flow channels 111 and distributed in the chamber 110. Each composite capillary structure 20 includes a metal mesh 21 and a plurality of sintered powder 22 uniformly sintered in the metal mesh 21. In one embodiment of this disclosure, the metal mesh 21 includes a U-shaped mesh, and the metal mesh 21 is extended from one end of each flow channel 111 to another opposite end of each flow channel 111.

It is worth of noticing that this disclosure further provides a manufacturing method of the integrated vapor chamber. The step a) is integrally forming a flat casing 11 and a plurality of partitions 12. The flat casing 11 includes a chamber 110 as a phase change chamber. The partitions 12 are disposed in the chamber 110 to separate the chamber 110 into a plurality of flow channels 111. Specifically, the partitions 12 are integrally formed with the flat casing 11 through the process such as extrusion. The flow channels 111 are arranged spacedly and parallelly to each other, and each of the flow channels 111 is an independent passageway.

Then the step b) is providing a plurality of composite capillary structures. Each composite capillary structure 20 includes a metal mesh 21 and a plurality of powder 22 uniformly distributed in the metal mesh 21. In this embodiment, the metal mesh 21 includes a U-shaped mesh, and the metal mesh 21 is extended from one end of each flow channel 111 to another opposite end of each flow channel 111.

The step c) is disposing each metal mesh 21 with the powder 22 in each of the flow channels 111. Furthermore, the step d) is sintering the composite capillary structures 20 to make the powder 22 be sintered and combined in each metal mesh 11. It should be noted that the sintered powder 22 is uniformly and flatly combined with the metal mesh 21. Accordingly, the composite capillary structures 20 are multi-directional and have better capillary capacity. Therefore, the composite capillary structures 20 have better capability of transmitting liquid.

Figure 2:
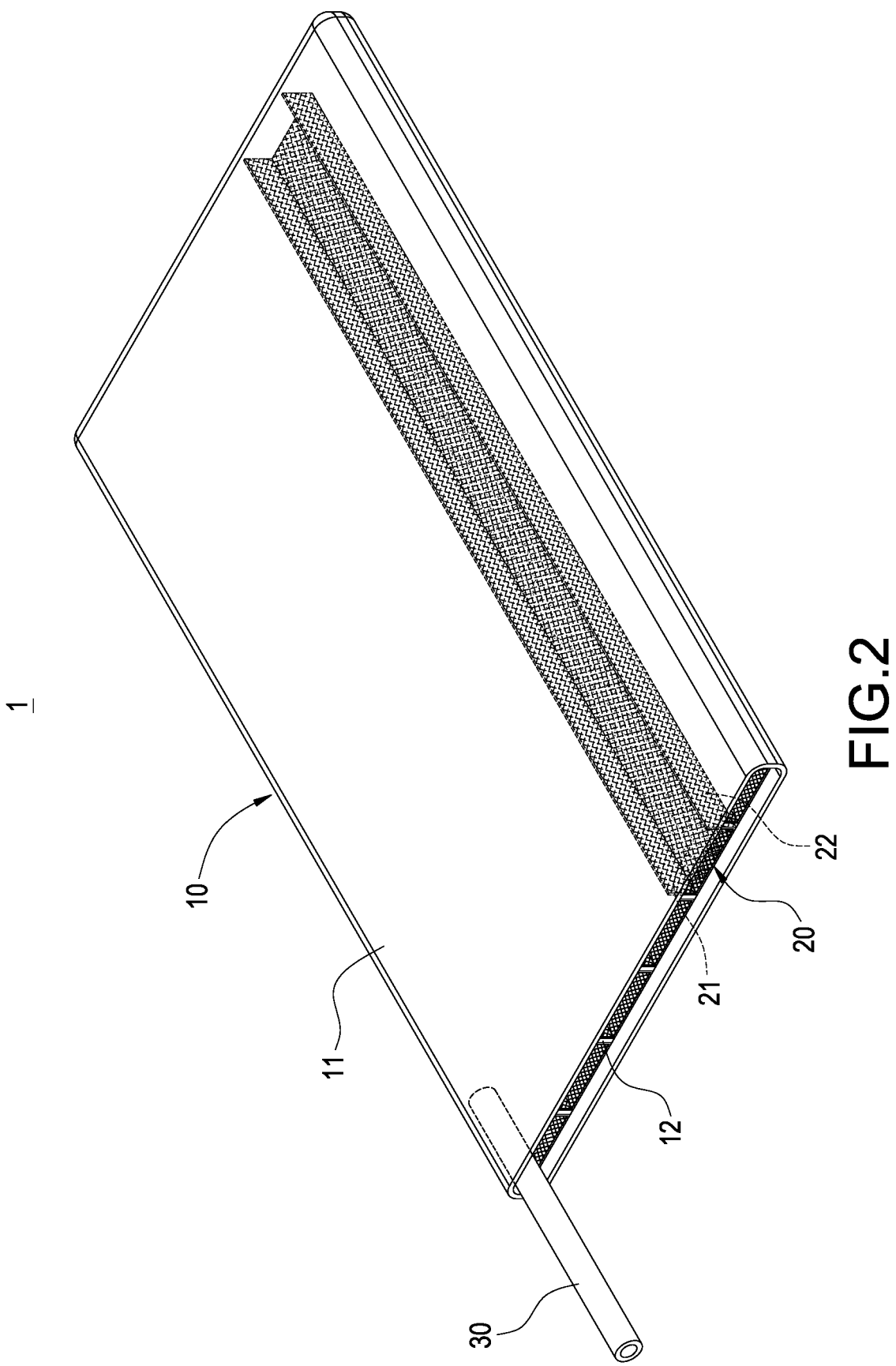
FIG. 2 is a perspective schematic view of the integrated vapor chamber in this disclosure.
Figure 3:
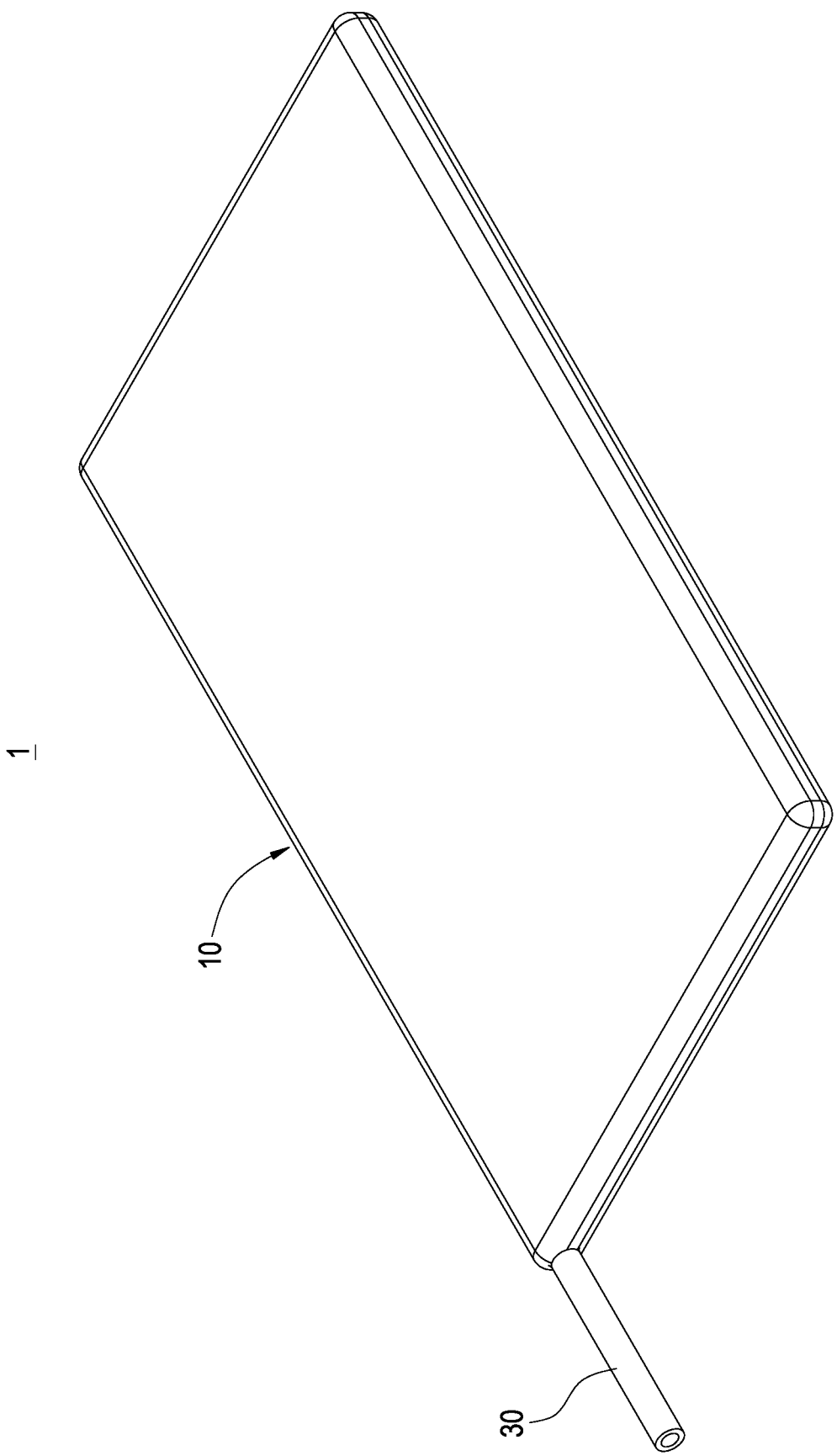
FIG. 3 is a perspective schematic view of the integrated vapor chamber with the degassing head in this disclosure.
Figure 4:
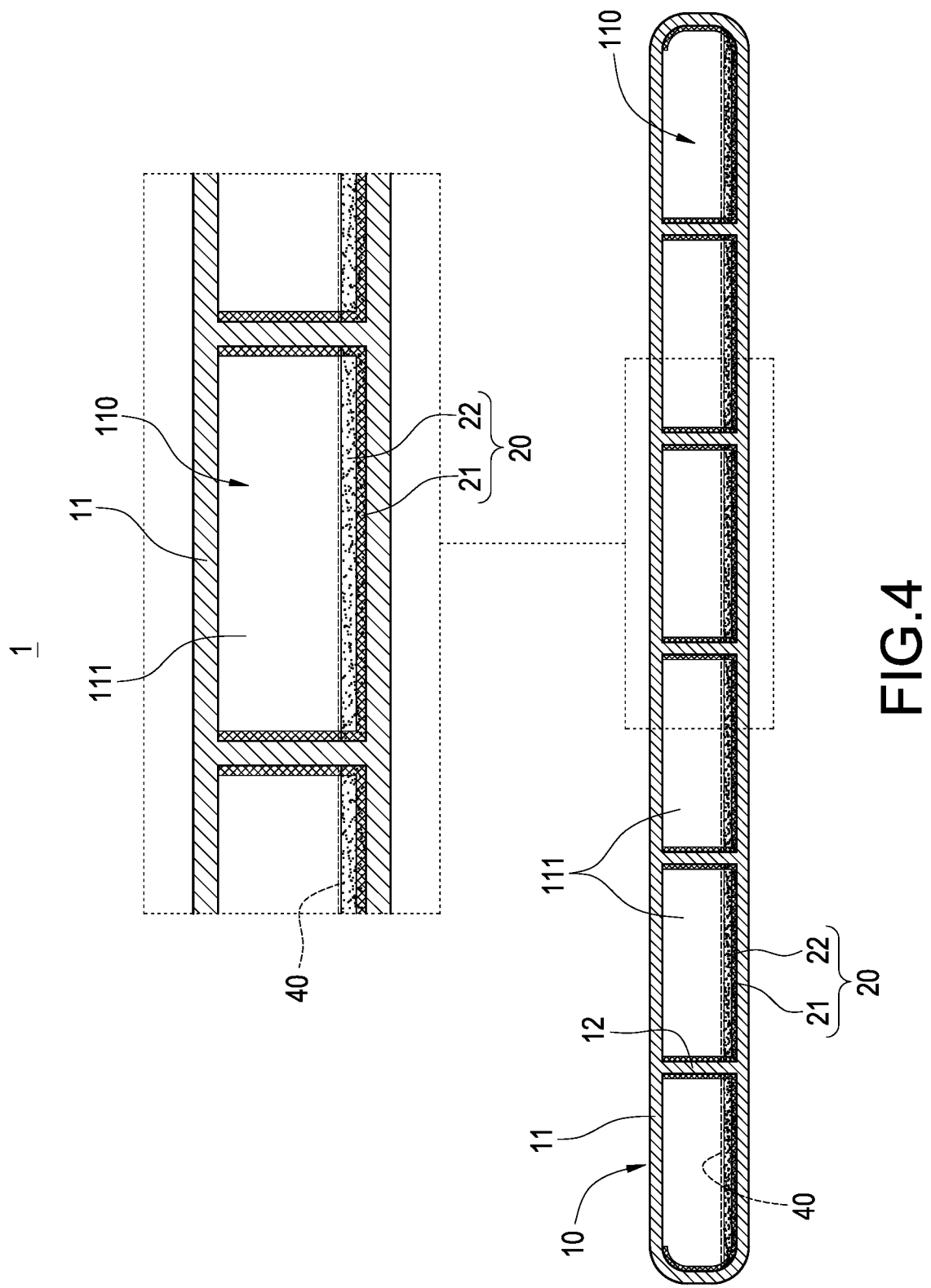
FIG. 4 is a cross sectional view of the integrated vapor chamber in this disclosure.

Please further refer to FIG. 2 and FIG. 3. The step e) is combining a degassing head 30 on the flat shell 11. Additionally, the step f) is degassing the flat shell 11 through the degassing head 30. With referring to FIG. 4, the working fluid 40 is injected into the chamber 110 and flows into each flow channel 111, and then operations of vacuuming and sealing are performed. Finally, the step g) is cutting the degassing head 30. As shown in FIG. 4, it depicts the integrated vapor chamber 1 processed according to the steps of aforementioned manufacturing method.

Figure 5:
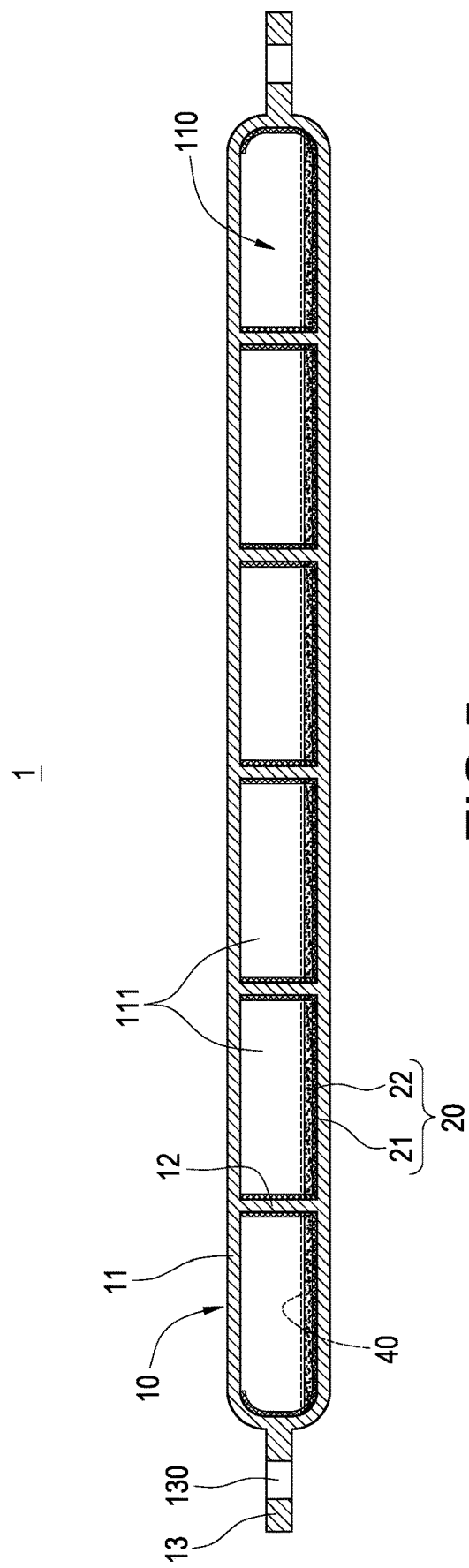
FIG. 5 is another embodiment of the integrated vapor chamber in this disclosure.

Please further refer to FIG. 5, it depicts another embodiment of the integrated vapor chamber. This embodiment is similar to the previous embodiment, and the difference is that opposite sides of the flat casing 11 are respectively formed with a shoulder plate 13, and a through hole 130 is dispose on the shoulder plate 13. The through hole 130 is disposed for inserting a fastener such as a screw, etc., to fix the integrated vapor chamber 1.

While this disclosure has been described by means of specific embodiments, numerous modifications and variations could be made thereto by those skilled in the art without departing from the scope and spirit of this disclosure set forth in the claims.

What is claimed is:

1. A manufacturing method of an integrated vapor chamber, the manufacturing method comprising:
    a) integrally forming a flat casing and a plurality of partitions, wherein the flat casing comprises a chamber, and the partitions are disposed in the chamber to separate the chamber into a plurality of flow channels;
    b) providing a plurality of composite capillary structures, wherein each of the composite capillary structures comprises a metal mesh and a plurality of powder uniformly distributed in each of the metal mesh;
    c) disposing each of the metal mesh with each of the powder in each of the flow channels;
    d) sintering each of the composite capillary structures to make each of the powder be sintered and combined in each of the metal mesh;
    e) combining a degassing head on the flat casing;
    f) degassing the flat casing and injecting a working fluid into the flat casing through the degassing head, and performing vacuuming and sealing; and
    g) cutting the degassing head.

2. The manufacturing method according to claim 1, wherein the step a) further comprises integrally forming the flat casing and the partitions through extrusion.

3. The manufacturing method according to claim 1, wherein the step a) further comprises arranging the flow channels to be spaced and parallel to each other, and each of the flow channels is an independent passageway.

4. The manufacturing method according to claim 1, wherein the step a) further comprises respectively forming a shoulder plate on opposite sides of the flat casing, and disposing a through hole on the shoulder plate.

5. The manufacturing method according to claim 1, wherein each of the metal mesh comprises a U-shaped mesh, and each of the metal mesh is extended from one end of each flow channel to another end of each flow channel.

* * * * *